(12) United States Patent
Chao

(10) Patent No.: US 8,406,001 B2
(45) Date of Patent: Mar. 26, 2013

(54) ELECTRONIC HOUSING, ASSEMBLIES THEREFOR AND METHODS OF MAKING SAME

(75) Inventor: Michael Chy Chao, San Jose, CA (US)

(73) Assignee: DualSonic, Inc., San Jose, CA (US)

( * ) Notice: Subject to any disclaimer, the term of this patent is extended or adjusted under 35 U.S.C. 154(b) by 317 days.

(21) Appl. No.: 12/713,073

(22) Filed: Feb. 25, 2010

(65) Prior Publication Data
US 2010/0220453 A1    Sep. 2, 2010

Related U.S. Application Data

(60) Provisional application No. 61/208,878, filed on Feb. 27, 2009.

(51) Int. Cl.
*H05K 5/00* (2006.01)

(52) U.S. Cl. ........ 361/752; 361/728; 361/737; 361/753; 361/800; 361/818; 439/76.1; 439/638; 174/359; 174/377; 29/832; 29/846

(58) Field of Classification Search .................. 361/752, 361/728, 737, 753, 800, 818; 439/76.1, 638; 174/359, 377; 29/832, 846
See application file for complete search history.

(56) References Cited

U.S. PATENT DOCUMENTS

| | | | |
|---|---|---|---|
| 5,397,857 A | 3/1995 | Farquhar et al. | 174/52.1 |
| 5,490,891 A | 2/1996 | Farquhar et al. | 156/73.1 |
| 5,497,297 A | 3/1996 | Kilmer et al. | 361/737 |
| 5,780,365 A * | 7/1998 | Nogami | 439/76.1 |
| RE35,873 E * | 8/1998 | Simmons et al. | 361/818 |
| 5,861,602 A * | 1/1999 | Cox et al. | 219/121.64 |
| 5,879,170 A * | 3/1999 | Nogami | 439/76.1 |
| RE36,540 E | 2/2000 | Farquhar et al. | 156/73.1 |
| 6,105,244 A | 8/2000 | Lin et al. | 29/841 |
| 6,109,931 A * | 8/2000 | Yotsutani | 439/76.1 |
| 6,134,114 A * | 10/2000 | Ungermann et al. | 361/737 |
| 6,142,793 A * | 11/2000 | Schremmer et al. | 439/76.1 |
| 6,269,537 B1 * | 8/2001 | Kimura et al. | 29/832 |
| 6,272,017 B1 * | 8/2001 | Klatt et al. | 361/737 |
| 6,315,205 B1 * | 11/2001 | Bates, III | 235/479 |
| 6,527,188 B1 | 3/2003 | Shobara et al. | 235/486 |
| 7,059,913 B1 * | 6/2006 | Chen | 439/638 |
| 7,518,880 B1 * | 4/2009 | Ziberna | 361/737 |
| 2001/0017215 A1 * | 8/2001 | Kimura et al. | 174/52.1 |
| 2001/0019475 A1 * | 9/2001 | Kimura et al. | 361/752 |
| 2002/0124400 A1 * | 9/2002 | Kimura et al. | 29/846 |
| 2002/0160661 A1 | 10/2002 | Florescu | 439/630 |
| 2004/0017673 A1 * | 1/2004 | Chao | 361/800 |
| 2004/0022035 A1 * | 2/2004 | Chang | 361/752 |
| 2005/0088827 A1 | 4/2005 | Zhang | 361/720 |
| 2008/0310277 A1 * | 12/2008 | Iwase | 369/75.11 |

* cited by examiner

*Primary Examiner* — Xiaoliang Chen
(74) *Attorney, Agent, or Firm* — Seed IP Law Group PLLC

(57) ABSTRACT

An electronic housing is provided comprising a first cover assembly combinable with a second cover assembly to house or enclose a printed circuit board therebetween. Each cover assembly includes a cover and a frame, the cover attachable to the frame by bending portions of the cover thereabout. The cover is preferably stamped metal and the frame is preferably injection molded plastic. Each cover may include recesses such that, when the cover is bent around the frame, the cover bends at the recesses and closely engages the frame on multiple mating surfaces. The cover assemblies may be welded together, such as by ultrasonic welding, to form a complete package or housing, and may include intermittingly spaced shear weld features to improve bond strength therebetween. Methods of manufacturing and/or assembling electronic housings and cover assemblies are also provided.

12 Claims, 12 Drawing Sheets

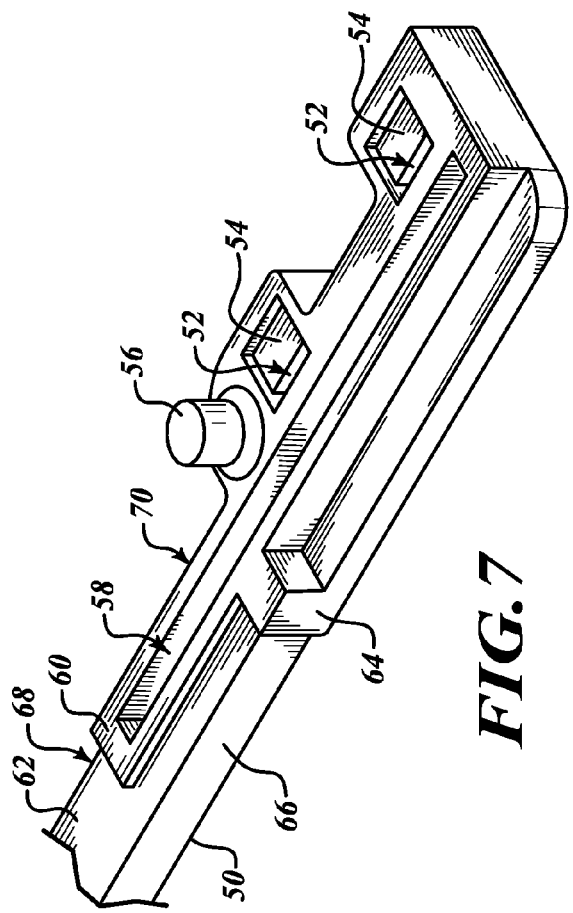
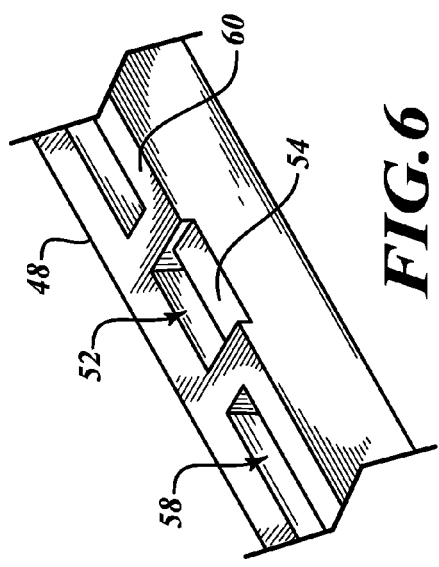
FIG. 6
FIG. 7

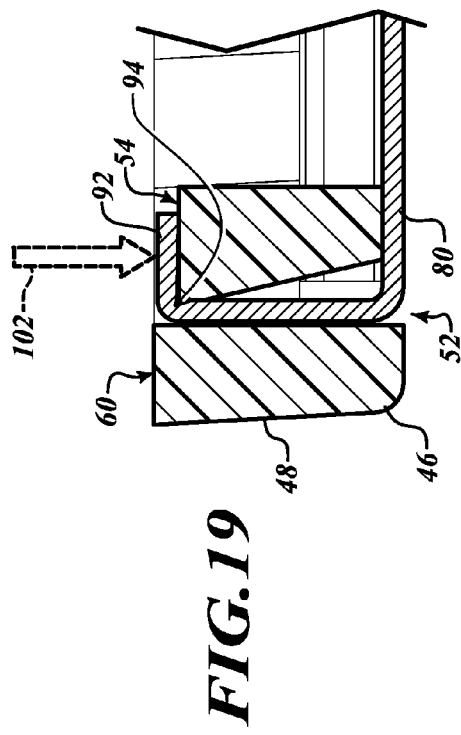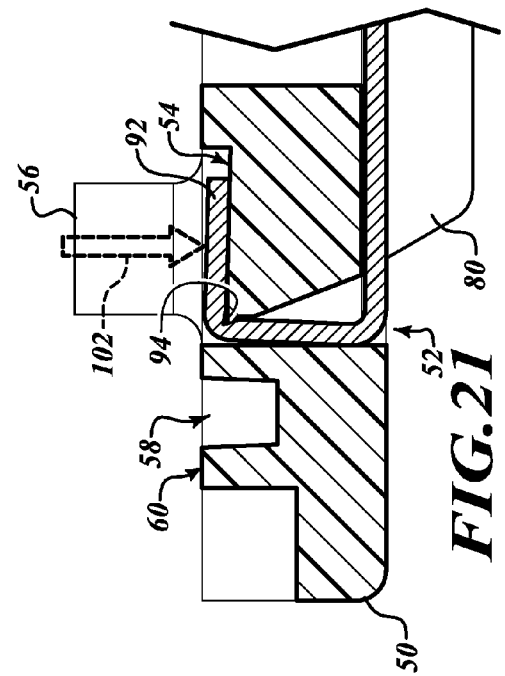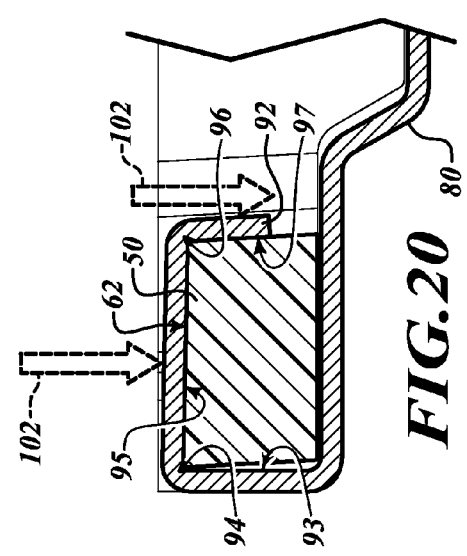

ELECTRONIC HOUSING, ASSEMBLIES THEREFOR AND METHODS OF MAKING SAME

CROSS-REFERENCE TO RELATED APPLICATION

This application claims the benefit under 35 U.S.C. §119(e) of U.S. Provisional Patent Application No. 61/208,878 filed Feb. 27, 2009, incorporated herein by reference in its entirety.

BACKGROUND

1. Technical Field

This disclosure generally relates to electronic housings or enclosures for computer peripheral devices, such as, for example, housings or enclosures for PCMCIA or PC cards.

2. Description of the Related Art

Small electronic housings or enclosures conforming to various interface standards such as, for example, PCMCIA or PC Card, ExpressCard, CF, Cfast, Sata, or Pata interface standards, typically have tight dimensional constraints and tolerances. Consequently, thin metal covers and plastic frames are commonly used to maximize the height and area within these housings or enclosures for internal components. Some known enclosure designs include over-molded, snap-together and adhesively bonded electronic enclosures. Such enclosures, however, suffer from various deficiencies and disadvantages. For example, over-molded enclosures are typically mechanically strong but expensive to manufacture due to the nature of the labor-intensive over-molding process. Snap together enclosures are less mechanically robust, result in relatively smaller internal volumes and are relatively more difficult to assemble. Adhesively bonded enclosures generally result in relatively smaller internal volumes and are much slower to assemble, as time is required for the adhesive to cure.

Consequently, Applicant believes improved housings or enclosures for electronic devices, such as housings or enclosures for PC cards and similar form factors, are desirable. The housings or enclosures should be capable of mass production using a highly cost-effective, consistent and rapid manufacturing process and should result in a rugged final assembly that meets pre-defined mechanical specifications while simultaneously providing maximum internal volume for electronic components.

BRIEF SUMMARY

At least one embodiment of a cover assembly of an electronic housing particularly adapted for consistent mass production may be summarized as including a frame, the frame including a cross member and a leg extending substantially perpendicular from each of a first end and a second end of the cross member, and the frame having an outer mating surface offset from an opposing inner mating surface by a frame thickness; and a cover coupled to the frame, the cover having a first edge member and a second edge member extending respectively from a first side and a second side of a base thereof, a first portion of each edge member extending substantially perpendicular to the base and having a first mating surface delineated from a second mating surface of a second portion of the edge member by a primary recess, and wherein each edge member is configured such that, when the edge member is bent at the primary recess at a substantially perpendicular angle, the first mating surface of each edge member abuts a respective side of the frame and the second mating surface of each edge member abuts the inner mating surface of the frame. Each of the first and the second edge members of the cover may include a plurality of tabs integral therewith, at least a portion of a tab of each edge member delineated from the remainder of the edge member by a secondary recess. The primary and the secondary recesses of each of the first and the second edge members may define substantially linear regions having reduced cross sections relative to adjacent portions of the edge members to ensure bending occurs at the linear regions when the edge members are subjected to a force, the edge members bending under relatively less force and conforming relatively more closely to the frame when bent than identically sized edge members without any primary and any secondary recesses. Each edge member may be configured such that, when the edge member is bent at each of the primary and the secondary recesses at substantially perpendicular angles, the portion of the tab delineated by the secondary recess is aligned substantially perpendicular to the base of the cover. Each of the primary and the secondary recesses may be a groove or an indentation. The frame may include a plurality of intermittingly spaced shear weld features configured to couple with a complementary frame. The cover may have a third edge member perpendicular to the first and the second edge members, the third edge member having a tab integral therewith, and the cross-member of the frame may include an aperture sized and shaped to receive the tab. The cross-member may include a pocket positioned to receive a portion of the tab such that, when the tab is bent at a substantially perpendicular angle, an outer surface of the portion of the tab is substantially parallel with the inner mating surface of the frame. Each of the first, second and third edge members of the cover may include a plurality of tabs integral therewith, and the frame may include a plurality of intermittingly spaced shear weld features positioned so each shear weld feature is located between two adjacent tabs. The cover may include a first intermediate edge member and a second intermediate edge member, a first portion of each of the first and the second intermediate edge members parallel to and offset inwardly from the first portion of each of the first and the second edge members, respectively. The cover may be stamped sheet metal and the frame may be injection molded plastic.

At least one embodiment of an electronic housing may be summarized as including a first cover assembly including a cover coupled to a frame, the cover having a first edge member and a second edge member extending respectively from a first side and a second side of a base of the cover, a first portion of each edge member extending substantially perpendicular to the base and having a first mating surface delineated from a second mating surface of a second portion of the edge member by a primary recess, and wherein each edge member is configured such that, when the edge member is bent at the primary recess at a substantially perpendicular angle, the first mating surface of each edge member abuts a respective side of the frame and the second mating surface of each edge member abuts an inner mating surface of the frame; and a second cover assembly including a complementary cover coupled to a complementary frame, the complementary cover having a first edge member and a second edge member extending respectively from a first side and a second side of a base of the complementary cover, a first portion of each edge member extending substantially perpendicular to the base and having a first mating surface delineated from a second mating surface of a second portion of the edge member by a primary recess, and wherein each edge member is configured such that, when the edge member is bent at the primary recess at a substantially perpendicular angle, the first mating surface of each edge member abuts a respective side of the complementary frame and the second mating surface of each edge member abuts an inner mating surface of the complementary frame. The frame of the first cover assembly may include a plurality of intermittingly spaced female shear weld features adapted to receive respective male shear weld features of the complementary frame of the second cover assembly. Each of the first and the second edge members of the cover of the first cover assembly may include a plurality of tabs integral therewith, and each of the female shear weld features of the frame of the first cover assembly may be located between two adjacent tabs. The first cover assembly may be welded to the second cover assembly. The cover and complementary cover may be stamped sheet metal and the frame and complementary frame may be injection molded plastic. The electronic housing may further include a printed circuit board assembly positioned between the first cover assembly and the second cover assembly.

At least one embodiment of a method for manufacturing a cover assembly for an electronic housing may be summarized as including molding a frame to include a first leg and a second leg extending substantially perpendicular from a first end and a second end of a cross-member, respectively, the frame having an outer mating surface offset from an opposing inner mating surface by a frame thickness; forming a cover to include a base and a first edge member and a second edge member, each edge member extending substantially perpendicular to the base and having a first mating surface delineated from a second mating surface by a primary recess; aligning the cover with the frame; and bending each edge member at the primary recess to a substantially perpendicular angle such that the first mating surface of each edge member abuts a respective side of the frame and the second mating surface of each edge member abuts the inner mating surface of the frame.

Forming the cover may include forming the cover to include at least one tab integral with each of the first and the second edge members, at least a portion of each tab of each edge member delineated from the remainder of the edge member by a secondary recess. The method may further include bending the tab of each edge member at the secondary recess to a substantially perpendicular angle such that the portion of each tab delineated by the secondary recess is aligned substantially perpendicular to the base.

Molding a frame may include molding the frame to include a plurality of intermittingly spaced shear weld features.

Forming the cover may include forming the cover to include a third edge member perpendicular to the first and the second edge members, the third edge member having a tab integral therewith, and molding the frame may include molding the frame to include at least one aperture extending through the cross-member sized and shaped to receive the tab. Molding the frame may include molding the frame to include a pocket positioned on the cross-member to receive a portion of the tab when the tab is bent to a substantially perpendicular angle. The method may further include bending a portion of the tab to a substantially perpendicular angle such that the portion of the tab is between the outer and inner mating surfaces of the frame.

Bending each edge member at the primary recess to a substantially perpendicular angle may include bending each edge member incrementally with a series of forms.

The method may further include placing the cover and frame in a fixture to restrain movement of the frame outwardly during the bending of the edge members. The method may further include inserting a form between the first leg and the second leg of the frame to restrain movement of the frame inwardly during the bending of the edge members.

The electronic housings and cover assemblies and methods of making the same described herein provide for the manufacture of electronic housings or enclosures that are particularly well adapted for mass production and which are characterized by relatively large internal volumes and robust, rugged form factors.

Further objects and advantages of the electronic housings, cover assemblies and methods taught herein will become clear by studying the disclosure, drawings and claims.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles may not be drawn to scale, and some of these elements may be arbitrarily enlarged and positioned to improve drawing legibility.

FIG. 6 is a partial isometric view of the lower frame of FIG. 5.

FIG. 7 is a partial isometric view of the lower frame of FIG. 5.

FIG. 19 is a partial cross-sectional view of the frame and cover of FIG. 12 taken along line 19-19 in a bent condition.

FIG. 20 is a partial cross-sectional view of the frame and cover of FIG. 12 taken along line 20-20 in a bent condition.

FIG. 21 is a partial cross-sectional view of the frame and cover of FIG. 12 taken along line 21-21 in a bent condition.

DETAILED DESCRIPTION

In the following description, certain specific details are set forth in order to provide a thorough understanding of various disclosed embodiments. However, one skilled in the relevant art will recognize that embodiments may be practiced without one or more of these specific details. In other instances, well-known structures and manufacturing techniques associated with electronic housings may not be shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
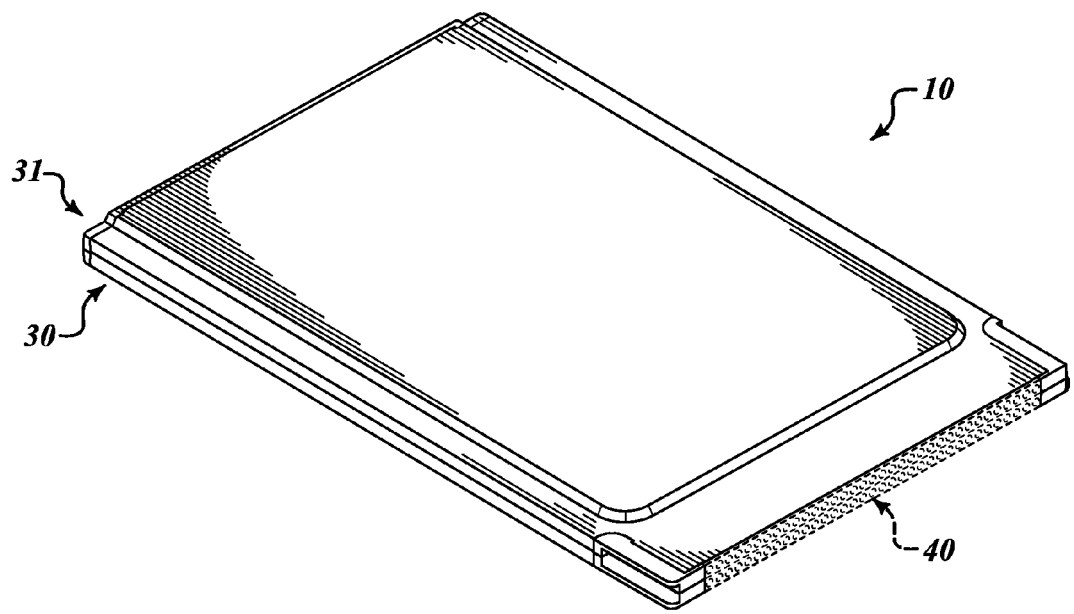
FIG. 1 is an isometric view of an electronic housing according to one embodiment.

For ease of understanding, an electronic housing 10 conforming to the PCMCIA PC card type II interface is illustrated in FIG. 1 and will be used as an example housing but such should not be considered limiting. For example, electronic housings conforming to various other interfaces or form factors, such as, for example, PCMCIA PC type I and type III, PCMCIA ExpressCard 34 and ExpressCard 54, CF I and CF II, Cfast, Sata and Pata, are contemplated. Further, the housings and cover assemblies described herein may be used for other applications with or without internal electronic components to produce, for example, various tamper proof or hermetically sealed types of enclosures.

Figure 2:
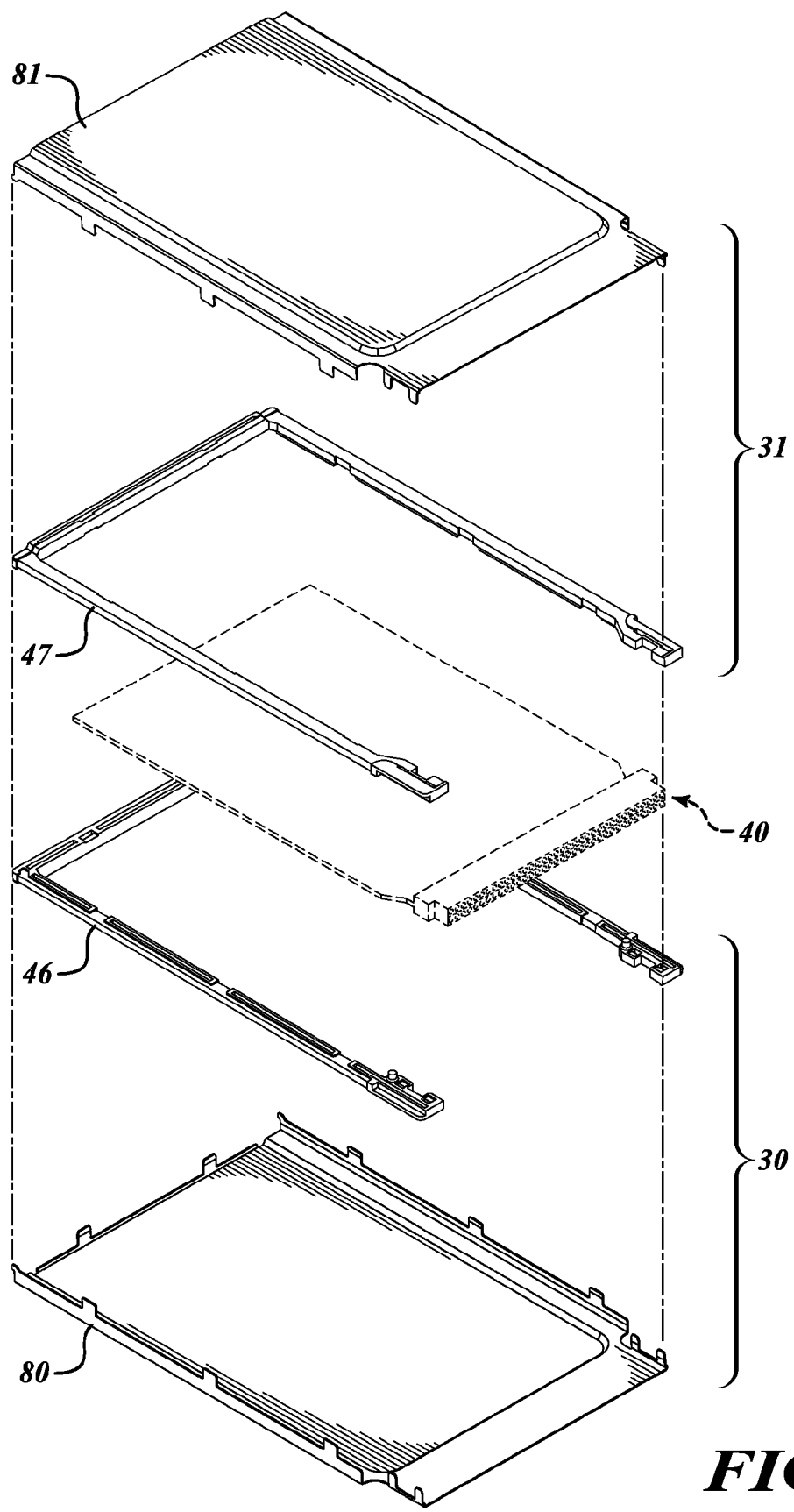
FIG. 2 is an exploded isometric view of the electronic housing of FIG. 1.

With reference to FIGS. 1 and 2, an electronic housing 10 is provided, according to one embodiment, that includes a lower cover assembly 30 attachable to an upper cover assembly 31 to enclose a printed circuit board assembly 40 therebetween. The lower cover assembly 30 includes a lower frame 46 and lower cover 80, and similarly, the upper cover assembly 31 includes an upper frame 47 and upper cover 81. The frames 46, 47 are preferably injection molded plastic, but may comprise other materials and be formed via other known manufacturing methods, such as, for example, die casting, milling or other machining methods. The covers 80, 81 are preferably stamped from sheet metal using a manual or progressive die, but may comprise other materials and be formed via other known manufacturing methods, such as, for example, hot rolling or other fabrication processes. The frames 46, 47 are tooled and formed separately from the covers 80, 81 such that the frames 46, 47 are formed independently therefrom. In this manner, the covers 80, 81 may be supplied separate from the frames 46, 47 and subsequently secured thereto using a manual or automated forming or bending process. This allows for, amongst other things, the application of high volume molding techniques to the frames 46, 47 separate from the covers, which in turn, allows for efficiency gains in the overall manufacturing process of the cover assemblies 30, 31.

As illustrated in FIG. 2, the lower cover 80 and upper cover 81 may be formed identically. Accordingly, for ease of understanding, various features and structures of the covers 80, 81 will be described with respect to lower cover 80, but may also apply to upper cover 81.

Figure 3:
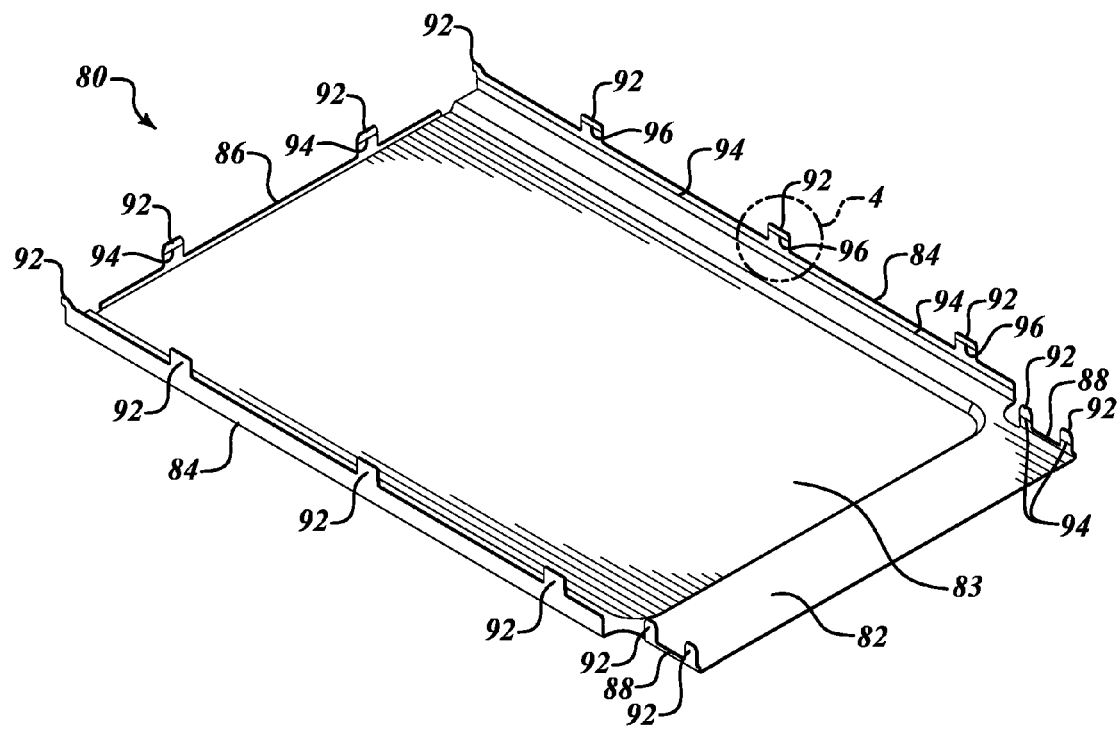
FIG. 3 is an isometric view of a lower cover of the electronic housing of FIG. 1.

As illustrated best in FIG. 3, lower cover 80 includes a base 82 and side edge members 84 extending respectively from each side thereof. In a pre-assembled condition, the side edge members 84 extend substantially perpendicular to the base 82 to form vertically extending sidewalls, and the base 82 has a substantially flat portion configured to abut the lower frame 46 during assembly. The base 82 of the lower cover 80 may also include a stepped or offset central portion 83 that is configured to create a relatively larger internal volume for housed components.

Figure 4:
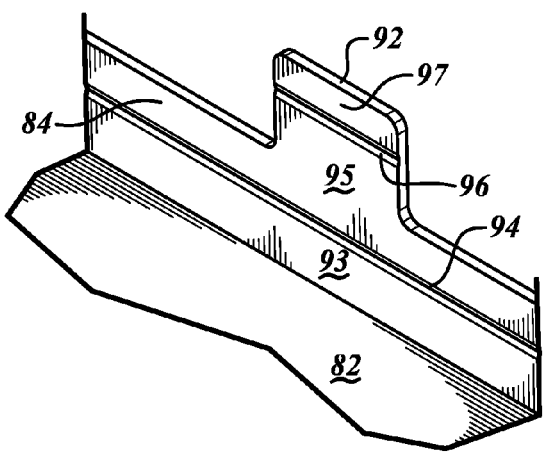
FIG. 4 is a partial isometric view of the lower cover of FIG. 3.

As illustrated in FIGS. 3 and 4, an inner surface of each of the side edge members 84 is separated in to distinct mating surfaces or regions by a primary recess 94 in the form of a groove or indentation, for example, that extends substantially parallel to the base 82. More particularly, a primary recess 94 is positioned to delineate a first mating surface 93 of each side edge member 84 from a second mating surface 95 such that, when each side edge member 84 is bent at the primary recess 94 to a substantially perpendicular angle, the first mating surface 93 of each side edge member 84 is configured to abut a respective outer side 66 (shown best in FIGS. 5 and 7) of lower frame 46 and the second mating surface 95 of each side edge member 84 is configured to abut an inner mating surface 62 (shown best in FIGS. 5 and 7) of the lower frame 46. In this manner, portions of the side edge members 84 are adapted to engage or clamp around the lower frame 46 and secure the lower cover 80 in close contact with the lower frame 46. In some embodiments, when the side edge members 84 are in the bent configuration, an outer surface of the edge members 84 is substantially flush with a joining surface 60 (shown best in FIGS. 5, 6 and 7) of the lower frame 46, and in other embodiments, the outer surface of the edge members may be slightly offset from the joining surface 60.

Each of the side edge members 84 may further include a plurality of tabs 92 integrally formed therewith for aligning and securing the lower cover 80 to the lower frame 46 during assembly. For example, as illustrated in FIG. 3, the opposing side edge members 84 may each include four tabs 92 integrally formed therewith. Further, secondary recesses 96 in the form of grooves or indentations, for example, may be provided on one or more of the tabs 92 to delineate a portion 97 of the tabs 92 from the remainder of each of the respective side edge members 84. More particularly, secondary recesses 96 may be positioned to delineate a portion 97 of one or more of the tabs 92 from the remainder of the side edge member 84 such that, when the side edge member 84 is bent at each of the primary and the secondary recesses 94, 96 to a substantially perpendicular angle, the portion 97 of each tab 92 delineated by the secondary recess 96 is aligned substantially perpendicular to the base 82 of the lower cover 80. The secondary recesses 96 may further be positioned such that when the side edge member 84 is bent at each of the primary and the secondary recesses 94, 96 to a substantially perpendicular angle, the portion 97 of each tab 92 delineated by a secondary recess 96 abuts an inner side 68 (shown best in FIG. 5) of the lower frame 46. In this manner, the side edge members 84 may be bent to closely encircle the lower frame 46 and secure the lower cover 80 thereto.

The lower cover 80, as illustrated in FIG. 3, may further include a transverse upstanding edge member 86 located between and aligned perpendicular to the side edge members 84. The transverse edge member 86 being offset inwardly from the end of the lower cover assembly 30 such that, when the lower cover 80 is aligned with the lower frame 46 during assembly, the transverse edge member 86 intersects and is retained within a correspondingly sized slot in the lower frame 46. The transverse edge member 86 may further include one or more distinct tabs 92 formed integrally with the transverse edge member 86 with a portion of each tab 92 being delineated by a respective primary recess 94. In this manner, the transverse edge member 86 may be bent at the primary recesses 94 during assembly such that a portion of each tab 92 is aligned substantially parallel to the base 82 of the lower cover 80. The transverse edge member 86 is able to engage or clamp around a portion of the lower frame 46 and retain the lower cover 80 thereto.

The lower cover 80, as illustrated in FIG. 3, may further include opposing intermediate edge members 88 at a front end of the lower cover assembly 30 which, in a pre-assembled condition, extend parallel to and are offset inwardly from the side edge members 84. The intermediate edge members 88 are also positioned to engage a correspondingly sized slot on the lower frame 46 during assembly. Each intermediate edge member 88 may further include one or more distinct tabs 92 formed integrally therewith a portion of each tab 92 delineated from the remainder of the intermediate edge member 88 by a primary recess 94. The portion of the tab 92 delineated by the primary recess 94 may be bent inwardly such that during assembly the intermediate edge members 88 may engage or clamp around a portion of the of the lower frame 46 and retain the lower cover 80 thereto. The intermediate edge members 88 are particularly adapted to reinforce the front end of the lower cover assembly 30 proximate where an electronic connector may be received during assembly of a complete electronic housing 10.

The primary and the secondary recesses 94, 96 may be formed in the edge members 84, 86, 88 by manual or progressive stamping, laser etching, chemical etching, or other suitable methods of producing a bend line characterized by reduced material thickness. Further, although the recesses 94, 96 are shown as extending continuously across portions of the edge members 84, 86, 88, the recesses 94, 96 may extend intermittently, such as, for example, in intermittent perforations. The primary and the secondary recesses 94, 96 of each edge member 84, 86, 88 facilitate accurate and consistent bending during assembly by providing relief at bend locations to allow the edge members 84, 86, 88 to engage and closely abut the lower frame 46. More particularly, the primary and the secondary recesses 94, 96 define substantially linear regions having reduced cross sections relative to adjacent portions of the edge members 84, 86, 88 to ensure that bending occurs at the linear regions when the edge members 84, 86, 88 are subjected to a force. Consequently, the edge members 84, 86, 88 conform relatively more closely to the frame 46 when bent than identically sized edge members without any primary and any secondary recesses. The primary and the secondary recesses 94, 96 also reduce the amount of force otherwise required to make bends and prevent excessive forces that could deform or distort the lower frame 46 during assembly.

Figure 5:
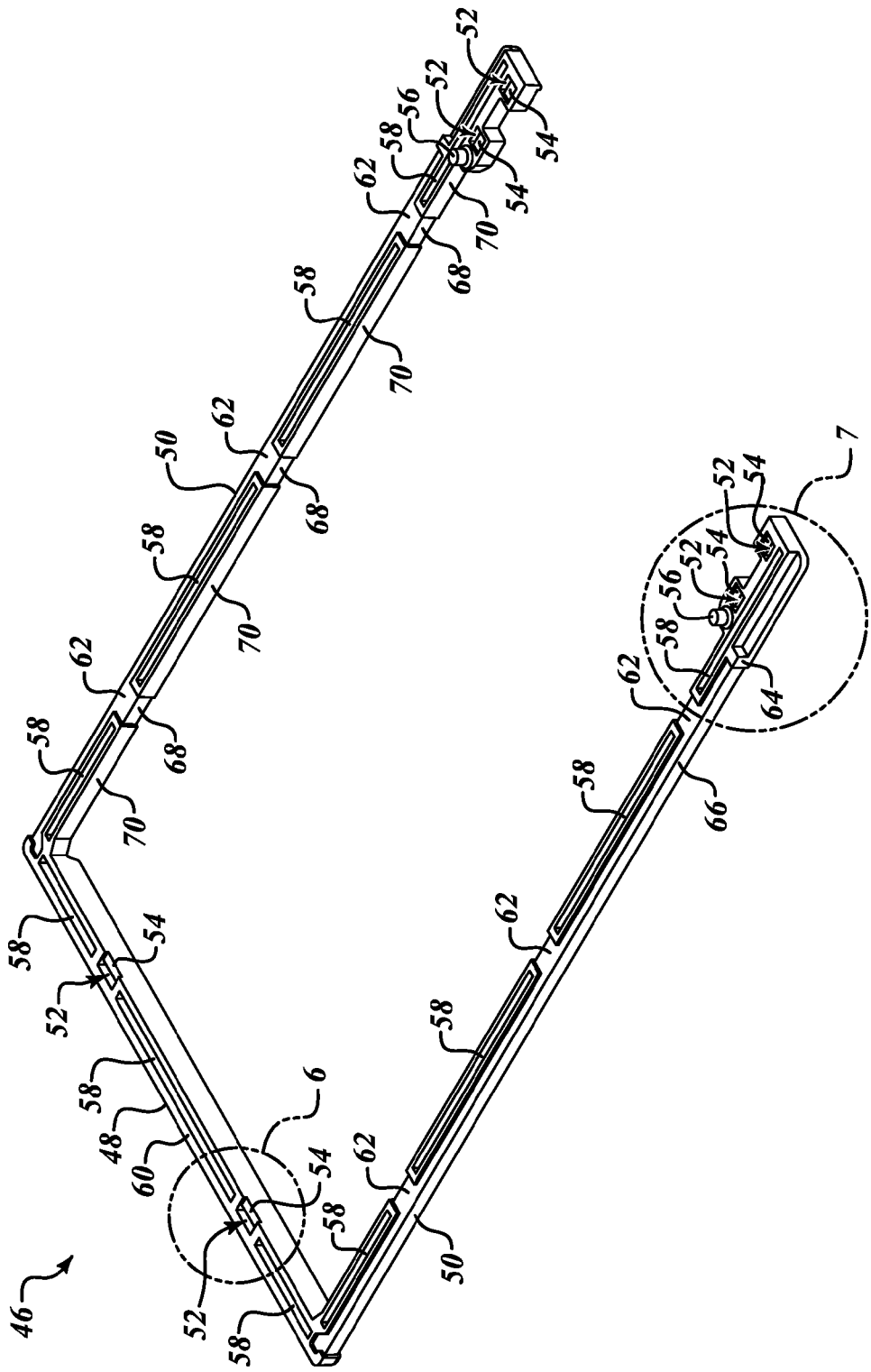
FIG. 5 is an isometric view of a lower frame of the electronic housing of FIG. 1.

FIGS. 5, 6 and 7 further illustrate the lower frame 46 of the electronic housing 10 of FIG. 1. As illustrated, the lower frame 46 is u-shaped including a cross-member 48 and an elongated leg 50 extending substantially perpendicular from each end thereof. The lower frame 46 further includes an outer mating surface (not visible) offset from an opposing joining surface 60 by a first thickness of the frame 46 and offset from an opposing inner mating surface 62 by a second thickness of the frame 46. The outer mating surface of the lower frame 46 is substantially flat and configured to abut the base 82 of the lower cover 80 during assembly. The joining surface 60 is also substantially flat and configured to abut a corresponding joining surface 61 (shown best in FIGS. 8, 9 and 10) on the upper frame 47 during assembly.

In some embodiments, the inner mating surface 62 is offset from the joining surface 60 by at least a thickness of the lower cover 80 such that, when the side edge members 84 of the lower cover 80 are bent at the primary recesses 94, a portion of the side edge members 84 are positioned entirely between the inner mating surface 62 and the joining surface 60. The lower frame 46 may further include a pocket 54 positioned on the cross-member 48 and/or legs 50 to receive a portion of a tab 92 of the lower cover 80 when the tab 92 is bent during assembly. In this manner, after assembly of the lower cover 80 and lower frame 46, a bent portion of the tab 92 may be substantially parallel to and positioned beneath the joining surface 60. In such embodiments, the lower frame 46 may include an aperture 52 adjacent each pocket 54 sized and shaped to receive the corresponding tab 92 of the lower cover 80. In this manner, the tab 92 may be received within an interior portion of the lower frame 46, rather than adjacent a side thereof.

In some embodiments, the legs 50 of the lower frame 46 include outer sides 66 recessed or set back from outermost side portions 64 by approximately a thickness of the lower cover 80 such that, when the cover 80 is aligned with the frame 46, the side edge members 84 substantially align with the outermost side portions 64 of the frame 46 to form a composite side surface of the lower cover assembly 30. Likewise, the legs 50 of the lower frame 46 may include inner sides 68 recessed or set back from innermost side portions 70, the inner sides 68 being configured to receive a portion 97 of tabs 92 that may be bent at secondary recesses 96 to encircle the legs 50 of the lower frame 46. When in the bent configuration, an outer surface of such tabs 92 and a surface of the innermost side portions 70 may combine to form a substantially flat interior side surface of the lower cover assembly 30.

Figure 12:
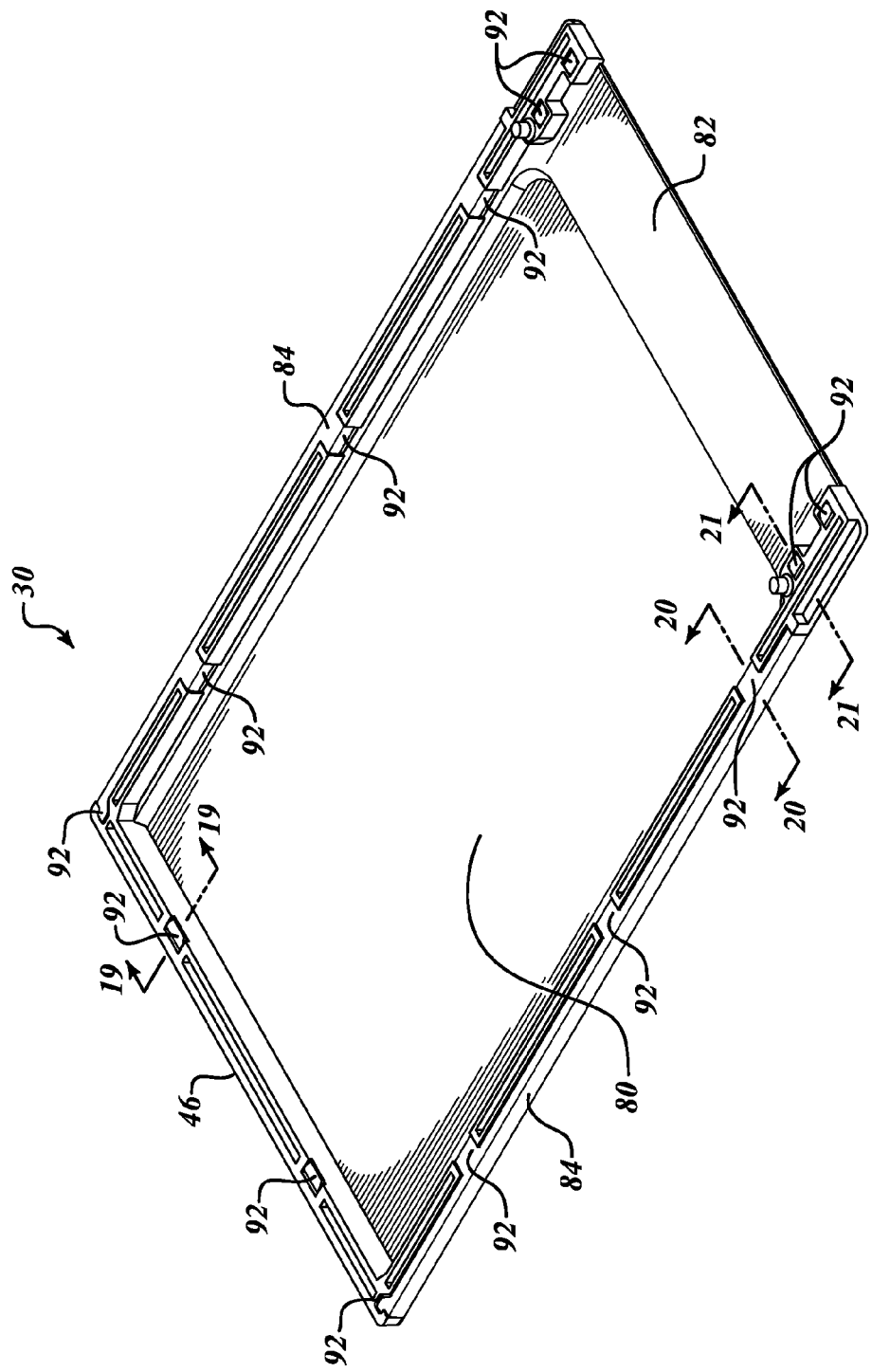
FIG. 12 is an isometric view of a lower cover of the electronic housing of FIG. 1 coupled with a lower frame of the electronic housing in an assembled condition.
Figure 13:
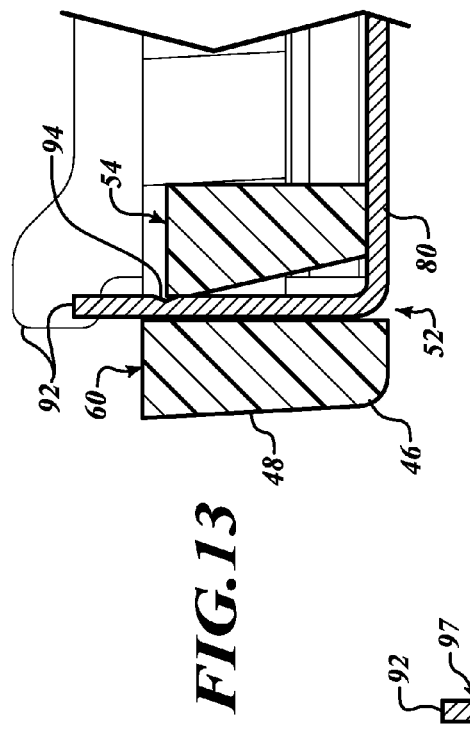
FIG. 13 is a partial cross-sectional view of the frame and cover of FIG. 11 taken along line 13-13.
Figure 14:
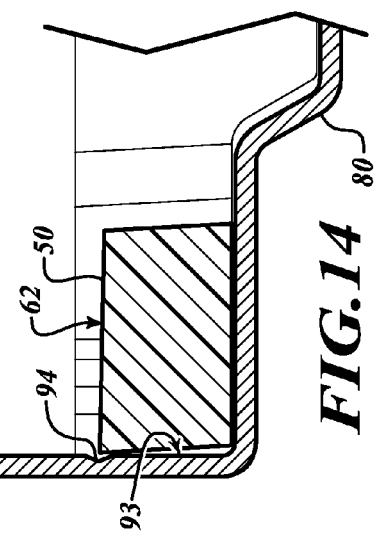
FIG. 14 is a partial cross-sectional view of the frame and cover of FIG. 11 taken along line 14-14.
Figure 15:
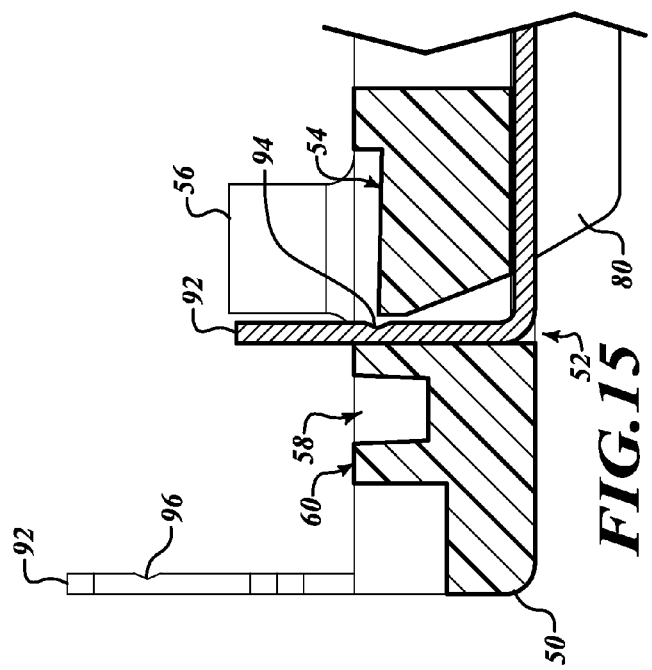
FIG. 15 is a partial cross-sectional view of the frame and cover of FIG. 11 taken along line 15-15.

In some embodiments, the lower frame 46 may further comprise a plurality of intermittingly spaced shear weld features, such as, for example, female shear weld features in the form of elongated slots 58. Shear weld features of the lower frame 46 are configured to couple with complementary shear weld features on the upper frame 47 during assembly. The shear weld features may be spaced symmetrically with respect to each side of the lower frame 46, as shown in FIG. 5, or may be asymmetrically spaced. The space between intermittent shear weld features may be sized or configured to receive portions of tabs 92 such that one or more of the intermittent shear weld features are located between adjacent tabs 92 when the lower frame 46 is aligned with and engages the lower cover 80, such as, for example, as shown in the lower cover assembly 30 of FIG. 12.

In some embodiments, the lower frame 46 may include one or more alignment devices to facilitate the alignment and joining of the lower frame 46 with a corresponding upper frame 47. For example, the lower frame 46 is shown in FIGS. 5 and 7 as having an upstanding cylindrical peg 56 proximate a front end of each leg 50 for engaging a corresponding cylindrical aperture 57 (shown best in FIGS. 8 and 10) in the upper frame 47. Although the alignment devices are shown as cylindrical pegs 56 and corresponding apertures 57 at the front end of the legs 50, 51, the size, shape and position of the alignment devices may vary in other embodiments. In some embodiments, the shear weld features may also serve as alignment devices. In other embodiments, the lower frame 46 may not have alignment devices.

Figure 8:
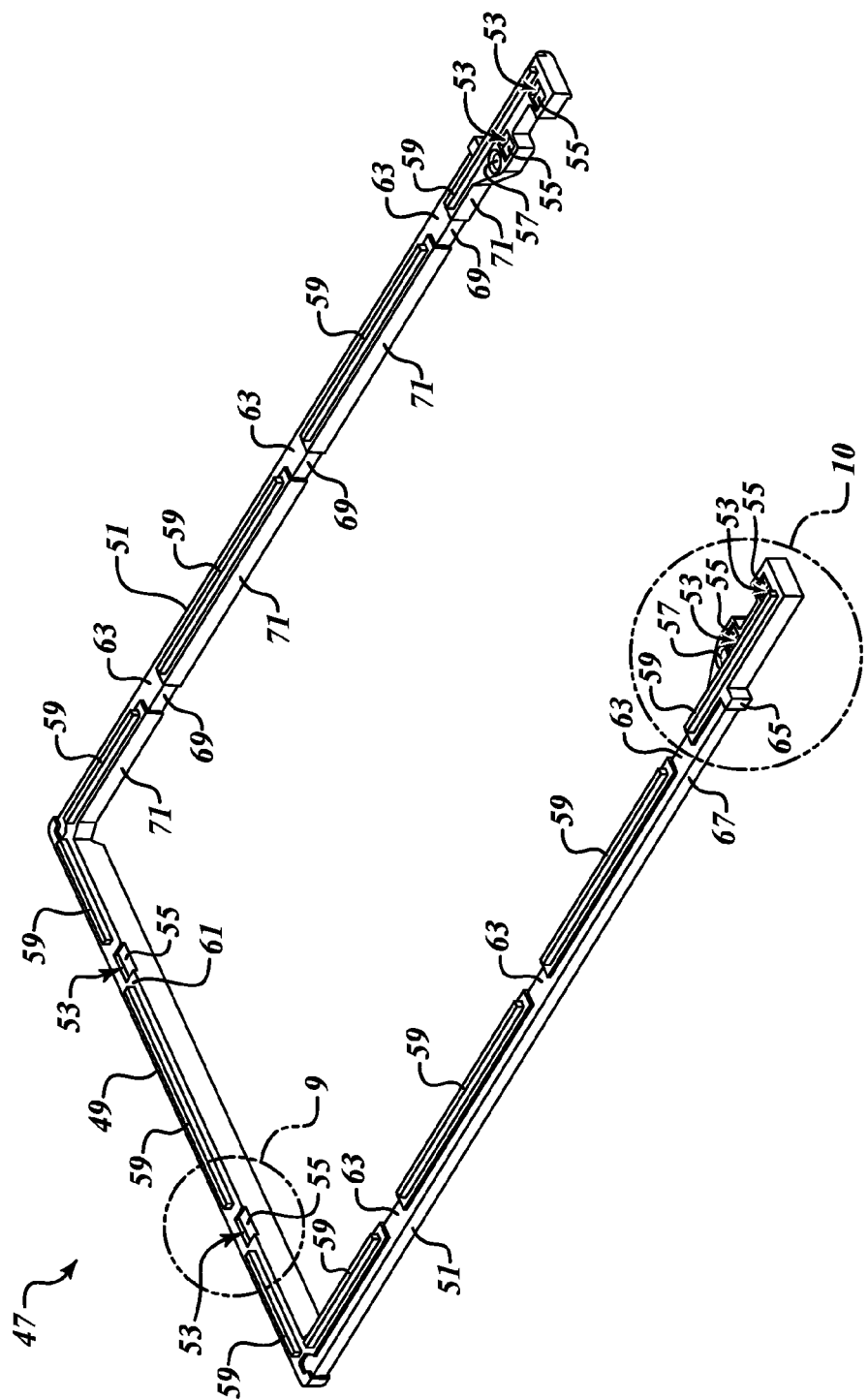
FIG. 8 is an isometric view of an upper frame of the electronic housing of FIG. 1.
Figure 9:
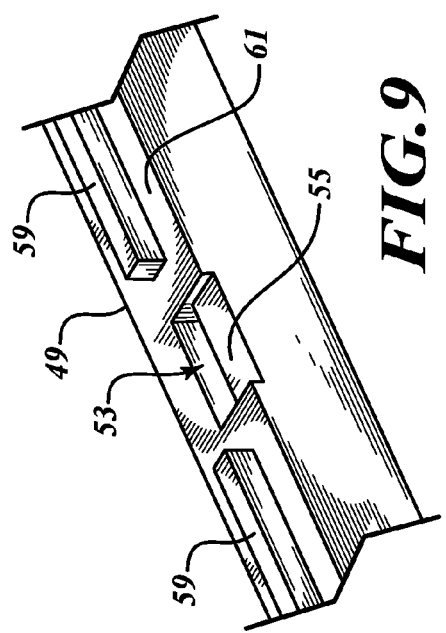
FIG. 9 is a partial isometric view of the upper frame of FIG. 8.
Figure 10:
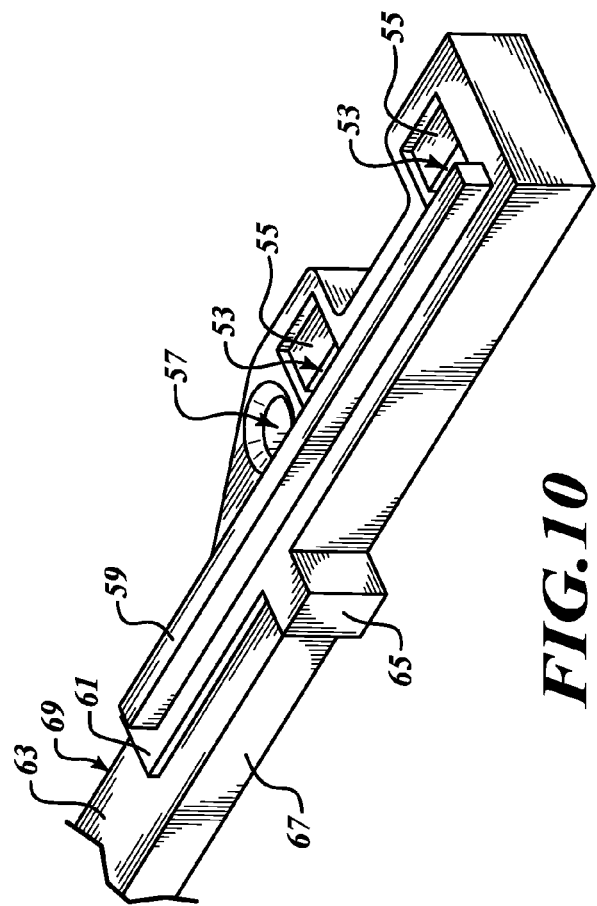
FIG. 10 is a partial isometric view of the upper frame of FIG. 8.

FIGS. 8, 9 and 10 further illustrate the upper frame 47 of the electronic housing 10 of FIG. 1. The upper frame 47 is illustrated as substantially a mirror image of the lower frame 46 apart from alignment devices in the form of cylindrical apertures 57 and shear weld features in the form of elongated projections 59. Consequently, the upper frame 47 is also u-shaped including a cross-member 49 and an elongated leg 51 extending substantially perpendicular from each end thereof. The upper frame 47 includes an outer mating surface offset from an opposing joining surface 61 by a first thickness of the frame 46 and offset from an opposing inner mating surface 63 by a second thickness of the frame 46. The outer mating surface of the upper frame 47 is substantially flat and configured to abut a base of the upper cover 81 during assembly. The joining surface 61 is also substantially flat and is configured to abut the corresponding joining surface 60 (best shown in FIGS. 5, 6 and 7) of the lower frame 46 during assembly.

Similar to the description of the lower cover 80 above, in some embodiments, the inner mating surface 63 of the upper cover 81 is offset from the joining surface 61 by at least the thickness of the upper cover 81 such that, when the side edge members of the upper cover 81 are bent at primary recesses, a portion of the side edge members are positioned entirely between the inner mating surface 63 and the joining surface 61. The upper frame 47 may further include a pocket 55 positioned on the cross-member 49 and/or legs 51 to receive a portion of a tab 92 of the upper cover 81 when the tab is bent during assembly. In this manner, after assembly of the upper cover 81 and upper frame 47, a bent portion of the tab 92 may be substantially parallel to and positioned beneath the joining surface 61. In such embodiments, the upper frame 47 may further include an aperture 53 adjacent each pocket 55 sized and shaped to receive a tab of the upper cover 81. In this manner, the tab 92 may be received within an interior portion of the upper frame 47, rather than adjacent a side thereof.

The legs 51 of the upper frame 47 include outer sides 67 recessed or set back from outermost side portions 65 by approximately a thickness of the upper cover 81 such that, when the cover 81 is aligned with the frame 47, the side edge members of the cover 81 substantially align with the outermost side portions of the frame 47 to form a composite side surface of the upper cover assembly 31. Likewise, the legs 51 of the upper frame 47 may include inner sides 69 recessed or set back from innermost side portions 71, the inner sides 69 being configured to receive a portion of tabs that may be bent at secondary recesses to encircle the legs 51 of the upper frame 47. When in the bent configuration, an outer surface of the tabs and a surface of the innermost side portions 71 may combine to form a substantially flat interior side surface of the upper cover assembly 31.

FIGS. 11 through 21 illustrate a method for assembling the lower cover assembly 30 which may similarly be used to assemble the upper cover assembly 31.

Figure 11:
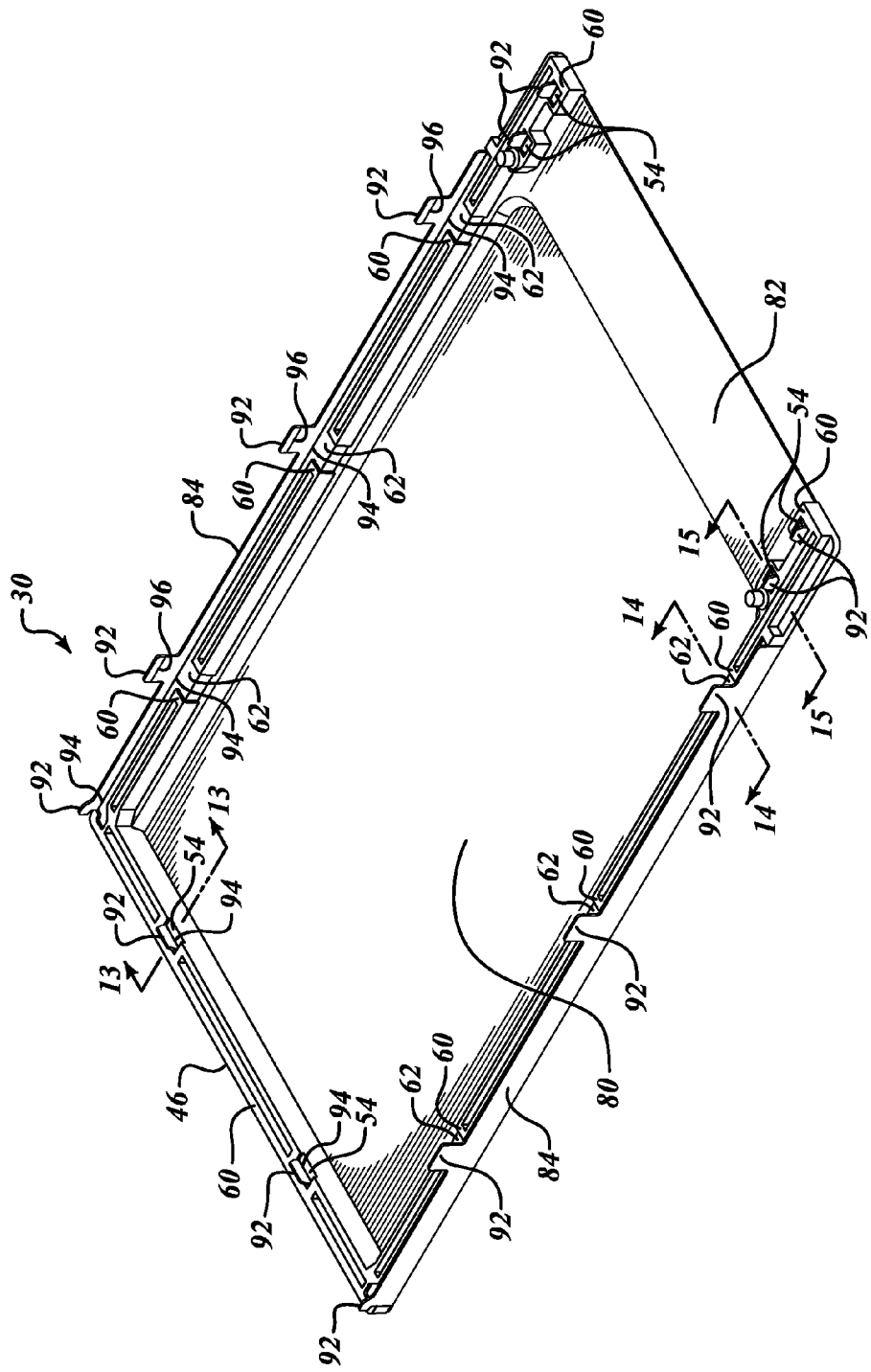
FIG. 11 is an isometric view of a lower cover of the electronic housing of FIG. 1 aligned with and abutting a lower frame of the electronic housing in a pre-assembled condition.

As illustrated in FIG. 11, the lower cover 80 is initially aligned with the lower frame 46 such that the base 82 of the lower cover 80 abuts the outer mating surface (not visible) of the lower frame 46 and the side edge members 84 abut respective outer sides 66 of the lower frame 46. The side edge members 84 may be received within respective recesses on the sides of the lower frame 46 such that an outer surface of a respective side edge member 84 substantially aligns with the outermost side portions 64 of the frame 46 to form a composite side surface of the lower cover assembly 30.

In the pre-assembled condition, as illustrated in FIG. 11, portions of the side edge members 84 extend vertically beyond the joining surface 60 of the lower frame 46. Further, tabs 92 in transverse edge member 86 and intermediate edge members 88 penetrate through corresponding apertures 52 (best shown in FIGS. 13 and 15) on the lower frame 46 and extend vertically beyond the joining surface 60 of the lower frame 46. Insertion of the tabs 92 in the corresponding apertures 52 assists in accurately aligning the lower cover 80 with the lower frame 46 to produce consistent assemblies during mass production. The tabs 92 extending through the frame 46 substantially prevent both fore and aft and side to side movement of the lower cover 80 with respect to the lower frame 46 in the pre-assembled condition.

Primary recesses 94 are positioned at selected heights along the edge members 84, 86, 88 corresponding to various thicknesses of the lower frame 46 such that, when the edge members 84, 86, 88 are bent about the frame 46, the edge members 84, 86, 88 bend at the respective primary recesses 94 and are able to closely conform to the outer profile of the frame 46. The primary recesses 94 weaken the edge members 84, 86, 88 at the recess locations and reduce the force required to bend the edge members 84, 86, 88. This prevents excessive forces that could otherwise deform or distort the frame 46 during assembly.

In some embodiments, the pre-assembled lower cover assembly 30, as illustrated in FIG. 11, may be placed in a fixture (not shown) to facilitate subsequent bending of the edge members 84, 86, 88. More particularly, the pre-assembled lower cover assembly 30 may be placed in a fixture having a cavity sized to closely receive the cover assembly 30 around its outer perimeter, such as, for example, by a friction fit. In such embodiments, the fixture is configured to prevent the cover assembly 30 from deflecting or moving outward when the edge members 84, 86, 88 are bent.

In some embodiments, a fixture block (not shown) having a perimeter that corresponds substantially to the interior surfaces of the lower frame 46 may be placed between the legs 50 of the lower frame 46 to prevent any significant inward movement of the lower cover assembly 30 when the edge members 84, 86, 88 are bent. For example, the fixture block may be placed between the legs 50 of the lower frame 46 with a friction fit. Preventing inward and outward movement with the fixture and fixture block facilitates consistent and accurate forming of the lower cover assembly 30 during mass production.

Figure 18:
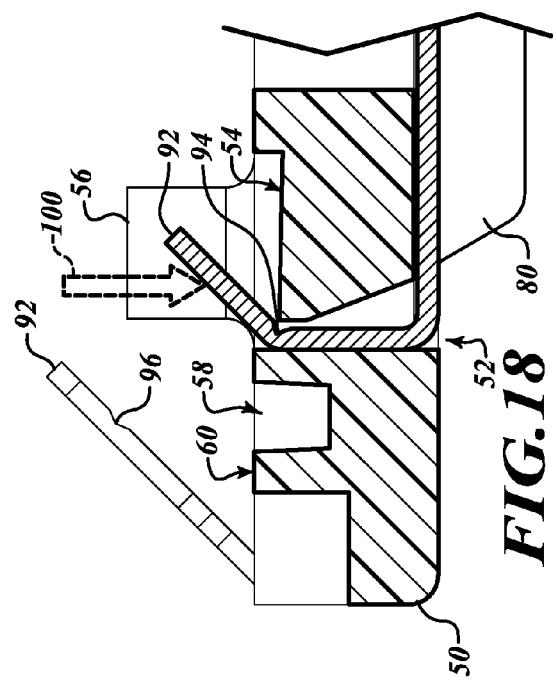
FIG. 18 is the partial cross-sectional view of the frame and cover of FIG. 15 in an intermediate bent condition.
Figure 16:
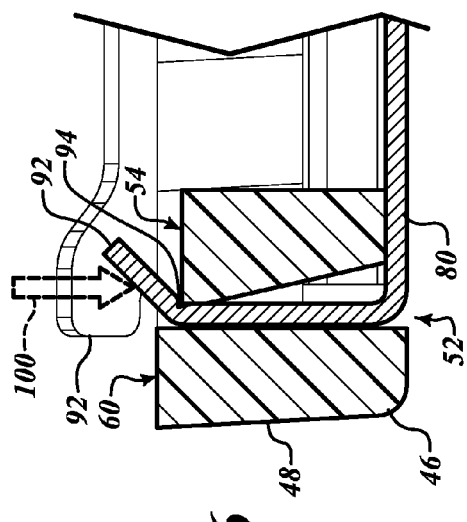
FIG. 16 is the partial cross-sectional view of the frame and cover of FIG. 13 in an intermediate bent condition.
Figure 17:
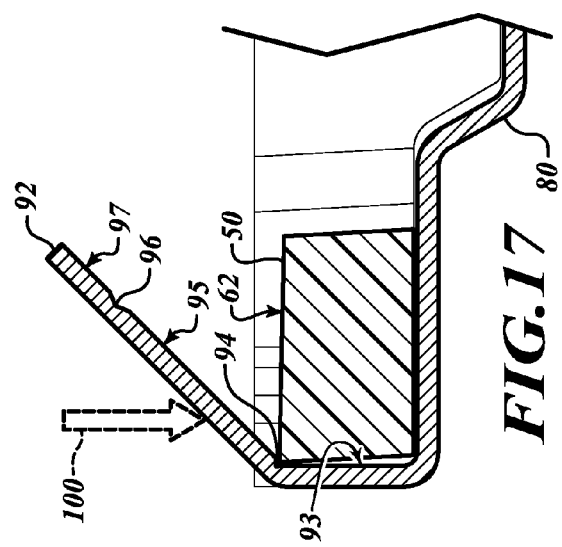
FIG. 17 is the partial cross-sectional view of the frame and cover of FIG. 14 in an intermediate bent condition.

In some embodiments, to bend or form the edge members 84, 86, 88, a first form block or die (not shown) may be used with manual or automatic structures or actuators to apply a bias 100 to portions of the edge members 84, 86, 88 towards the lower frame 46. As illustrated in FIGS. 16, 17 and 18, each of the edge members 84, 86, 88 may be bent with a first form block or die to an intermediate angle between an initial vertical position and a substantially horizontal position, such as, for example, to approximately a forty degree angle with respect to vertical. The first form block or die may be designed to approach the cover assembly 30 from a vertically overhead position with an appropriately positioned lead-in form angle above the vertical edge members 84, 86, 88. In other embodiments, a form block or die may be configured to approach from other directions, such as, for example, from the side. As the first form block or die compresses onto the edge members 84, 86, 88, bending naturally takes place at the primary recesses 94 located thereon. The primary recesses 94 are positioned to align with corresponding vertices of adjacent portions of the lower frame 46 such that the edge members 84, 86, 88 may bend in strict conformance with the outer profile of the frame 46. The addition of the primary recesses 94 allows for more consistent and repeatable dimensions of the lower cover assembly 30 that would otherwise be impossible.

In some embodiments, a second form block or die may subsequently be used with manual or automatic structures or actuators to apply another bias 102 to portions of the edge members 84, 86, 88. As illustrated in FIGS. 19, 20 and 21, a portion of each of the edge members 84, 86, 88 may be bent with the second form block or die to a final angle that is substantially parallel with the base 82 of the lower cover 80. Concurrently, a portion of the side edge members 84 may be bent at secondary recesses 96 formed thereon to approximately a perpendicular angle such that in the assembled condition the portion of the side edge members 84 is substantially perpendicular to the base 82 of the lower cover 80. In the assembled condition, the edge members 84, 86, 88 conform closely to an outer profile of the lower frame 46 and secure the lower cover 80 to the lower frame 46 in all directions.

In view of the above, a method for manufacturing a cover assembly 30 for an electronic housing 10, according to one embodiment, includes molding a frame 46 to include a first leg 50 and a second leg 50 extending substantially perpendicular from a first end and a second end of a cross-member 48, respectively, the frame 46 having an outer mating surface offset from an opposing inner mating surface 62 by a frame thickness. In some embodiments, molding the frame 46 may include molding the frame 46 to include a plurality of intermittingly spaced shear weld features and may further include molding the frame 46 to include one or more pockets 54 positioned on the cross-member 48 to receive a portion of a respective tab 92 of a cover 80 that is adapted to mate with the frame 46. Molding the frame 46 may also include molding the frame 46 to include at least one aperture 52 extending through the cross-member 48 that is sized and shaped to receive a tab 92 of a cover 80 that is adapted to mate with the frame 46.

The method for manufacturing a cover assembly 30 further includes forming a cover 80 that is adapted to mate with the frame 46, the cover 80 including a base 82 and a first edge member 84 and a second edge member 84, each edge member 84 extending substantially perpendicular to the base 82 and having a first mating surface 93 delineated from a second mating surface 95 by a primary recess 94. In some embodiments, forming the cover 80 may include forming the cover 80 to include at least one tab 92 integrally formed with each of the first and the second edge members 84, and wherein at least a portion of each tab 92 of each edge member 84 is delineated from the remainder of the edge member 84 by a secondary recess 96. In still further embodiments, forming the cover 80 may include forming the cover 80 to include a third edge member 86 perpendicular to the first and the second edge members 84, the third edge member 86 having at least one tab 92 integrally formed therewith.

Next, the method includes aligning the cover 80 with the frame 46 and bending each edge member 84, either incrementally or continuously, at a primary recess 94 to a substantially perpendicular angle such that the first mating surface 93 of each edge member 84 abuts a respective side 66 of the frame 46 and the second mating surface 95 of each edge member 84 abuts the inner mating surface 62 of the frame 46. In this manner, the edge members 84 closely engage or clamp around the frame 46 to secure the cover 80 thereto. The method may further include bending each edge member 84 at a secondary recess 96 to a substantially perpendicular angle such that a portion 97 of each edge member 84 delineated by the secondary recess 96 is aligned substantially perpendicular to the base 82. In this manner, the edge members 84 closely encircle a portion of the frame 46 to secure the cover 80 thereto.

In the bent condition, the edge members 84 are located entirely to one side of a joining surface 60 of the cover assembly 30, the joining surface 60 defining the boundary at which the cover assembly 30 is configured to mate with a corresponding joining surface 61 of a corresponding cover assembly 31. Bending the edge members 84 may be performed via a manual or automatic process. An automated system using progressive dies is particularly adapted to provide an efficient system for manufacturing cover assemblies 30 which avoids deficiencies associated with snap-together, adhesively bonded and over-molded cover assemblies and electronic housings.

Before bending the edge members 84 of the cover 80, the cover 80 and frame 46 may be placed or located in a fixture to restrain movement of the frame 46 outwardly during the bending process. In addition, a fixture block or form may be placed or inserted between the legs 50 of the frame 46 to restrain movement of the frame 46 inwardly during the bending process. In this manner, the cover 80 and frame 46 are substantially fixed in space to facilitate accurate and repeatable dimensions of the assembled cover assemblies 30.

As discussed earlier, a similar process may be used to manufacture both a lower cover assembly 30 and an upper cover assembly 31. Once manufactured, the individual cover assemblies 30, 31 may be secured together with a printed circuit board assembly 40 or other internal components located therebetween to form a complete electronic housing 10. In other embodiments, the cover assemblies 30, 31 may be packaged for shipment to a remote location for subsequent combination with internal components.

The lower and upper cover assemblies 30, 31 may be secured together via welding, such as, for example, by ultrasonic or high frequency welding or via adhesives or any other suitable joining method. In some embodiments, shear weld features, such as, for example, elongated slots 58 and corresponding elongated projections 59, may be formed in the frames 46, 47 to facilitate joining of the cover assemblies 30, 31 and for improving bond strength therebetween.

Joining the assemblies 30, 31 together may be guided by one or more alignment devices on each of the respective cover assemblies 30, 31, such as, for example, upstanding cylindrical pegs 56 and corresponding cylindrical apertures 57. Likewise, in some embodiments, proper alignment of the assemblies 30, 31 may be guided by the engagement of respective shear weld features located on each cover assembly 30, 31. In other embodiments, the cover assemblies 30, 31 may not include alignment devices and/or shear weld features. In such embodiments, fixtures may be used to accurately align the cover assemblies 30, 31 during the joining process. In the final assembled and joined condition, tabs 92 of the respective cover assemblies 30, 31 may be held in contact with each other such that the covers 80, 81 are commonly grounded and may provide EMI shielding around the housing 10.

Embodiments of the present disclosure are by no means limited to standard form factor housings or interfaces, such as, for example, the PCMCIA PC card type II interface. Rather, aspects of the various embodiments described herein may also apply, for example, to general electronic housings and peripheral packages having a variety of I/O openings for various electronic connectors.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cover assembly comprising:
a frame, the frame including a cross member and a leg extending substantially perpendicular from each of a first end and a second end of the cross member, and the frame having an outer mating surface offset from an opposing inner mating surface of the legs by a frame thickness, and the cross member and the legs of the frame having a joining surface offset from the inner surface of the legs to join with another frame; and
a cover coupled to the frame, the cover having a first edge member and a second edge member extending respectively from a first side and a second side of a base thereof, a first portion of each edge member extending substantially perpendicular to the base and having a first mating surface delineated from a second mating surface of a second portion of the edge member by a primary recess, and wherein each edge member is configured such that, when the edge member is bent at the primary recess at a substantially perpendicular angle to transition the cover from a first bent configuration to a second bent configuration, the second mating surface of each edge member is moved into an abutting relationship with the inner mating surface of the frame with the second portion of the edge member positioned between the inner mating surface and the joining surface.

2. The cover assembly of claim 1 wherein each of the first and the second edge members of the cover include a plurality of tabs integral therewith, at least a portion of one of the tabs of each edge member delineated from the remainder of the edge member by a secondary recess.

3. The cover assembly of claim 2 wherein the primary and the secondary recesses of each of the first and the second edge members define substantially linear regions having reduced cross sections relative to adjacent portions of the edge members to ensure bending occurs at the linear regions when the edge members are subjected to a force, the edge members conforming relatively more closely to the frame when bent than identically sized edge members without any primary and any secondary recesses.

4. The cover assembly of claim 2 wherein the primary and the secondary recesses of each of the first and the second edge members define substantially linear regions having reduced cross sections relative to adjacent portions of the edge members to ensure bending occurs at the linear regions when the edge members are subjected to a force, the edge members bending under relatively less force when bent than identically sized edge members without any primary and any secondary recesses.

5. The cover assembly of claim 2 wherein each edge member is configured such that, when the edge member is bent at each of the primary and the secondary recesses at substantially perpendicular angles, the portion of the tab delineated by the secondary recess is aligned substantially perpendicular to the base of the cover.

6. The cover assembly of claim 2 wherein each of the primary and the secondary recesses is a groove or an indentation.

7. The cover assembly of claim 1 wherein the frame includes a plurality of intermittingly spaced shear weld features configured to couple with a complementary frame.

8. The cover assembly of claim 1 wherein the cover has a third edge member perpendicular to the first and the second edge members, the third edge member having a tab integral therewith, and wherein the cross-member of the frame includes an aperture sized and shaped to receive the tab.

9. The cover assembly of claim 8 wherein the cross-member includes a pocket positioned to receive a portion of the tab such that, when the tab is bent at a substantially perpendicular angle, an outer surface of the portion of the tab is substantially parallel with the inner mating surface of the frame.

10. The cover assembly of claim 8 wherein each of the first, the second and the third edge members of the cover include a plurality of tabs integral therewith, and wherein the frame includes a plurality of intermittingly spaced shear weld features positioned so each shear weld feature is located between two adjacent tabs.

11. The cover assembly of claim 1 wherein the cover includes a first intermediate edge member and a second intermediate edge member, a first portion of each of the first and the second intermediate edge members parallel to and offset inwardly from the first portion of each of the first and the second edge members, respectively.

12. The cover assembly of claim 1 wherein the cover is stamped sheet metal and the frame is injection molded plastic.

* * * * *